(12) United States Patent
Chang et al.

(10) Patent No.: US 11,721,691 B2
(45) Date of Patent: Aug. 8, 2023

(54) DEVICE HAVING BIPOLAR JUNCTION TRANSISTORS AND FINFET TRANSISTORS ON THE SAME SUBSTRATE

(71) Applicant: Marvell Asia Pte Ltd, Singapore (SG)

(72) Inventors: Runzi Chang, Saratoga, CA (US); Bo Wang, Sunnyvale, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 225 days.

(21) Appl. No.: 17/204,971

(22) Filed: Mar. 18, 2021

(65) Prior Publication Data

US 2021/0296309 A1 Sep. 23, 2021

Related U.S. Application Data

(60) Provisional application No. 62/993,475, filed on Mar. 23, 2020.

(51) Int. Cl.
| | |
|---|---|
| *H01L 27/07* | (2006.01) |
| *H01L 29/78* | (2006.01) |
| *H01L 29/66* | (2006.01) |
| *H01L 29/73* | (2006.01) |

(52) U.S. Cl.
CPC .... *H01L 27/0711* (2013.01); *H01L 29/66234* (2013.01); *H01L 29/66795* (2013.01); *H01L 29/7302* (2013.01); *H01L 29/785* (2013.01)

(58) Field of Classification Search
CPC . H01L 27/0711–0722; H01L 29/66234; H01L 29/66795; H01L 29/7302; H01L 29/785; H01L 21/823493; H01L 21/8249; H01L 27/0623; H01L 29/0649; H01L 29/0692; H01L 29/1008; H01L 29/6625; H01L 29/735
See application file for complete search history.

(56) References Cited

U.S. PATENT DOCUMENTS

| | | | | |
|---|---|---|---|---|
| 5,017,996 A | * | 5/1991 | Yasuoka | H01L 27/0623 257/370 |
| 5,290,714 A | * | 3/1994 | Onozawa | H01L 27/0623 438/207 |

* cited by examiner

*Primary Examiner* — Wasiul Haider

(57) ABSTRACT

A method for producing a semiconductor device, the method includes, forming, on a substrate made from a semiconductor substance, at least one bipolar junction (BJ) transistor including a first terminal connected to a first well, the first well formed in the substrate and includes a first dopant having a first dopant concentration. At least one non-BJ transistor is formed on the substrate, the non-BJ transistor includes a second terminal connected to a second well, and the second well formed in the substrate and includes a second dopant having a same polarity as the first dopant. The first dopant concentration of the BJ transistor is higher than the second dopant concentration of the non-BJ transistor.

19 Claims, 3 Drawing Sheets

DEVICE HAVING BIPOLAR JUNCTION TRANSISTORS AND FINFET TRANSISTORS ON THE SAME SUBSTRATE

CROSS-REFERENCE TO RELATED APPLICATIONS

This application claims the benefit of U.S. Provisional Patent Application 62/993,475, filed Mar. 23, 2020, whose disclosure is incorporated herein by reference.

FIELD OF THE DISCLOSURE

The present invention relates generally to semiconductor devices, and particularly to methods and systems for improving electrical performance of bipolar junction transistors.

BACKGROUND

Various techniques are known in the art for integrating bipolar junction transistors (BJTs) in semiconductor devices.

The description above is presented as a general overview of related art in this field and should not be construed as an admission that any of the information it contains constitutes prior art against the present patent application.

SUMMARY

An embodiment of the present invention that is described herein provides a method for producing a semiconductor device, the method includes forming, on a substrate made from a semiconductor substance, at least one bipolar junction (BJ) transistor including a first terminal connected to a first well, the first well formed in the substrate and includes a first dopant having a first dopant concentration. At least one non-BJ transistor is formed on the substrate, the non-BJ transistor includes a second terminal connected to a second well, and the second well formed in the substrate and includes a second dopant having a same polarity as the first dopant. The first dopant concentration of the BJ transistor is higher than the second dopant concentration of the non-BJ transistor.

In some embodiments, the method includes forming on the substrate at least an additional non-BJ transistor, different from the non-BJ transistor, the additional non-BJ transistor includes a third terminal connected to a third well, the third well formed in the substrate and includes a third dopant having (i) the same polarity as the first dopant and (ii) a third dopant concentration that is lower than the first dopant concentration. In other embodiments, forming the BJ transistor, the non-BJ transistor and the additional non-BJ transistor includes: forming (i) the first dopant in the first well and (ii) the second dopant in the second well, using a first mask, and forming: (i) the first dopant in the first well and (ii) the third dopant in the third well, using a second mask. In yet other embodiments, forming the BJ transistor includes: (i) implanting the second dopant in the first well, and (ii) implanting the third dopant in the first well.

In an embodiment, implanting the second dopant includes implanting the second dopant in the first well and in the second well at a first time interval, and implanting the third dopant includes implanting the third dopant in the first well and in the third well at a second time interval, different from the first time interval. In another embodiment, forming the BJ transistor, the non-BJ transistor, and the additional non-BJ transistor includes forming the first dopant, the second dopant and the third dopant using a same dopant substance. In yet another embodiment, forming at least one of the BJ transistor, the non-BJ transistor and the additional non-BJ transistor, includes forming a fin field-effect transistor (finFET) by forming at least a three-dimensional gate over at least one of the first well, the second well and the third well.

In some embodiments, forming at least one of the BJ transistor, the non-BJ transistor and the additional non-BJ transistor, includes forming a planar field-effect transistor (FET) by forming at least a two-dimensional gate over at least one of the first well, the second well and the third well. In other embodiments, forming at least one of the BJ transistor, the non-BJ transistor and the additional non-BJ transistor, includes forming a gate-all-around (GAA) transistor, by forming at least a 3D-wire gate over at least one of the first well, the second well and the third well. In yet other embodiments, forming the BJ transistor includes forming at least: (i) an emitter having an emitter well, (ii) a base having a base well, and (iii) a collector having a collector well, the emitter well and the collector well have a first polarity and the base has a second polarity that is opposite to the first polarity, and the method includes forming within the substrate an isolation well for insulating between: (i) the collector well and (ii) the emitter well and base well.

There is additionally provided, in accordance with an embodiment of the present invention, a device, including a semiconductor substrate, at least one bipolar junction (BJ) transistor, and at least one non-BJ transistor. The at least one BJT includes a first terminal connected to a first well, the first well formed in the substrate and includes a first dopant having a first dopant concentration. The at least one non-BJ transistor includes a second terminal connected to a second well, the second well formed in the substrate and includes a second dopant having a same polarity as the first dopant, the first dopant concentration of the BJ transistor is higher than the second dopant concentration of the non-BJ transistor.

There is further provided, in accordance with an embodiment of the present invention, a semiconductor device including: (i) at least one bipolar junction (BJ) transistor, formed by producing on a substrate made from a semiconductor substance, a first well including a first dopant having a first dopant concentration, and connecting the first well to a first terminal, and (ii) at least one non-BJ transistor, formed by producing on the substrate a second well, including a second dopant having a same polarity as the first dopant, and connecting the second well to a second terminal, the first dopant concentration of the BJ transistor is higher than the second dopant concentration of the non-BJ transistor.

The present disclosure will be more fully understood from the following detailed description of the embodiments thereof, taken together with the drawings in which:

DETAILED DESCRIPTION OF EMBODIMENTS

Figure 1:
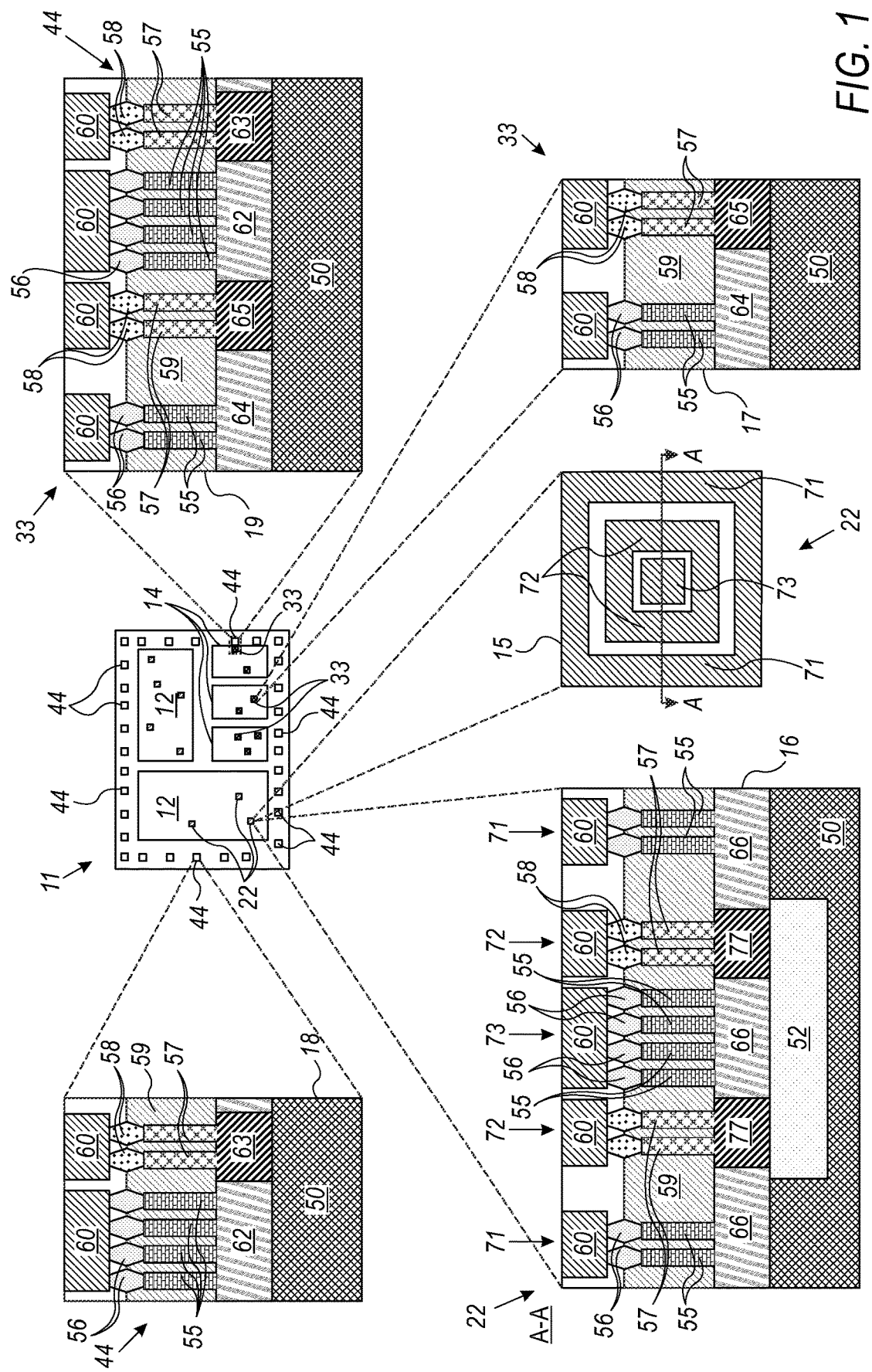
FIG. 1 is a schematic pictorial illustration of a semiconductor device having bipolar junction transistors (BJTs), in accordance with an embodiment that is described herein.

Analog circuits implemented in some semiconductor devices comprise bipolar junction transistors (BJTs) and other types of transistors, such as but not limited to unipolar field-effect transistors (FETs). Transistor types other than BJT are also referred to herein as non-BJTs.

The electrical performance of such analog circuits depends, inter alia, on a matched electrical performance (e.g., matched threshold voltage) among BJTs in the circuit. In the context of the present disclosure, BJTs are considered "matched" when a statistical variance in some electrical performance attribute among BJTs implemented in a common circuit, is smaller than a specified variance-threshold.

Embodiments of the present disclosure that are described herein, provide techniques for improving the electrical performance of analog circuits implemented using advanced technology nodes, by improving the matching among BJTs of the analog circuit.

Advanced technology nodes are used in producing small-sized transistors. The small transistor dimensions make advanced technology nodes (e.g., 5 nm nodes), highly sensitive to process variations. As such, using the same dopant concentration in the wells of the non-BJTs and BJTs may result in increased noise level in the BJTs, and consequently, in insufficient matching among the BJTs of the analog circuit. The disclosed techniques overcome this challenge.

In some embodiments, a semiconductor device comprises both BJTs (e.g., implemented in analog circuits) and non-BJTs. In the present example, the device comprises (i) unipolar core transistors comprising wells having a first dopant concentration, (ii) unipolar input output (IO) transistors comprising wells having a second, typically larger, dopant concentration, and (iii) BJTs comprising wells having a third dopant concentration. The third concentration is typically larger than the first and second dopant concentrations, so as to obtain the specified matching among the BJTs.

In principle, when producing the semiconductor device, it is possible to obtain the first, second and third dopant concentrations by performing at least three different sets of ion implantation processes, using three dedicated masks, each of which exposing the intended locations of the respective type of transistors. Such a process, however, is long and results in increased complexity and production costs.

In the disclosed embodiments, a process is carried out efficiently using only two different masks: (i) a first mask having openings for implanting ions both in the core transistors and the BJTs in a first ion implantation process, and (ii) a second mask having openings for implanting ions both in the IO transistors and the BJTs in a second ion implantation process. Using this efficient process, the dopant concentration of the BJTs is sufficient to meet the matching specification among the BJTs.

The disclosed techniques provide improved tradeoffs in producing advanced semiconductor devices comprising both BJTs and non-BJTs. The matching specification among the BJTs in the production process of such semiconductor devices is achieved with a reduced number of ion implantation operations.

The description above is presented as a general overview of embodiments of the present disclosure, which are described in detail herein.

FIG. 1 is a schematic pictorial illustration of a semiconductor device 11 having bipolar junction transistors (BJTs) 22, in accordance with an embodiment that is described herein.

In some embodiments, device 11 comprises BJTs 22, core transistors 33 and input output (IO) transistors 44. In the present example, BJTs 22 are arranged in arrays 12, core transistors 33 are arranged in arrays 14 and IO transistors 44 are arranged at the circumference of device 11, and are configured to exchange signals between device 11 and external devices. This arrangement is provided by way of example, and in other embodiments, in addition to one or more BJTs 22, device 11 may comprise any other suitable type of transistors, arranged in any suitable configuration.

In some embodiments, each BJT 22 uses both electrons and electron holes as charge carriers, and each core transistor 33 and IO transistor 44 comprises a unipolar transistor or any other suitable type of transistor other than BJT. In such embodiments, at least one of BJT 22 and transistors 33 and 44 may comprise: (i) planar field-effect transistors (FETs) also known as metal-oxide-semiconductor FETs (MOSFETs) having a two-dimensional (2D) gate formed over the wells of at least one of BJT 22, and transistors 33 and 44, or (ii) three-dimensional (3D) finFET transistors having a 3D gate formed over the wells of at least one of BJT 22, and transistors 33 and 44, or 3D gate-all-around (GAA) transistors having a 3D-wire gate formed over the wells of at least one of BJT 22, and transistors 33 and 44, or any other suitable type of transistors. In the present example, transistors 33 and 44 comprise finFET transistors having fin-based gates made from doped silicon fins 55 and 57, and BJTs 22 also comprise fins 55 and 57. In this configuration, fins 55 and 57 comprise p-type and n-type dopants, respectively. The structure of transistors 22, 33 and 44 is described in detail below.

Reference is now made to an inset 17 showing a sectional view of core transistor 33. In some embodiments, device 11 comprises a semiconductor substrate, in the present example made from silicon and referred to herein as a substrate 50.

In some embodiments, substrate 50 may be doped with p-type dopants, which is the present example, or with n-type dopants. In the context of the present disclosure and in the claims, the term p-type refers to a semiconductor section or a structure doped with impurities or dopants, such as boron, providing holes that readily accept electrons. Moreover, the term n-type, refers to a semiconductor section or a structure doped with impurities or dopants, such as phosphorus, that provide mobile electrons. Note that the type of dopants defines the polarity of the respective section or structure and the type of charge carriers (electrons and/or holes) in each transistor of device 11.

In some embodiments, core transistor 33 is formed on p-type substrate 50 of device 11, and comprises a p-well 64 having p-type dopants (e.g., boron) and an n-well 65 having n-type dopants (e.g., phosphorus), which are implanted in substrate 50. The dopants may be applied to substrate 50 using any suitable technique, such as ion implantation, or using a diffusion process. The dopant concentration is typically similar in wells 64 and 65, for example, between about $1*10^{15}$ ions per $Cm^3$ and $1*10^{17}$ ions per $Cm^3$. The process of forming wells 64 and 65 is described in detail in FIG. 2 below.

In the context of the present disclosure and in the claims, the terms "about" or "approximately" for any numerical values or range of numerical values, indicate a suitable dimensional tolerance that allows the part or collection of components, or a physical parameters such as thickness, or a physical constant, to function for its intended purpose as described herein.

In some embodiments, transistor 33 comprises fins 55 and 57, which are formed on the surface of substrate 50, and epitaxial layers 56 and 58 described below. In the present example, fins 55, p-well 64, and epitaxial layer 56, are doped with p-type dopants. Transistor 33 further comprises one or more fins 57, n-well 65, and epitaxial layer 58, which are doped with n-type dopants.

In some embodiments, epitaxial layers 56 and 58 are formed on the upper surface of fins 55 and 57, respectively. As shown in inset 17, epitaxial layers 56 and 58 are formed between (i) fins 55 and 57 and (ii) electrically-conductive interconnects, implemented in device 11 as layers 60, typically made from copper or any other suitable electrically-conductive substance.

In some embodiments, device 11 comprises a dielectric layer 59, such as silicon dioxide or any suitable type of low-k dielectric substance or compound, which is configured to electrically isolate between the fins, so that the charge carries (i.e., electrons and/or holes) are conducted within the wells, e.g., between the source and drain (not shown), and between the wells of device 11.

In some embodiments, during the operation of device 11, layers 60 and fins 55 and 57, which are connected to one another, are configured to serve as terminals connected to wells 64 and 65, respectively. In such embodiments, in response to voltage applied to transistor 33 via layers 60, electrons and/or holes are conducted e.g., between the source and drain of the well, so as to execute an electronic operation of device 11.

Reference is now made back to the general view of device 11. In some embodiments, core transistors 33 are configured to operate at relatively low voltage(s), for example, between about 0.2 V and 1.2 V, whereas IO transistors 44 are configured to operate at higher voltage(s), for example, between 1.2 V and 5.0 V, for exchanging signals between device 11 and external devices as described above.

Reference is now made to an inset 18 showing a sectional view of IO transistor 44. In some embodiments, IO transistor 44 comprises a p-well 62 having p-type dopants, such as boron, and an n-well 63 having n-type dopants, such as phosphorus, which are formed in substrate 50. Wells 62 and 63 may be produced using ion implantation or any other suitable technique, as described above for the wells of core transistor 33.

In some embodiments, because IO transistors 44 are configured to operate at voltages higher than that of core transistors 33, the dopant concentration of wells 62 and 63 is typically greater than in wells 64 and 65. In an embodiment, the dopant concentration is typically similar in wells 62 and 63, for example, between about $2*10^{15}$ ions per $Cm^3$ and $2*10^{17}$ ions per $Cm^3$. The process of forming wells 62 and 63 is described in detail in FIG. 2 below.

In some embodiments, IO transistor 44 further comprises fins 55 and 57, and dielectric layer 59, which are formed on the surface of substrate 50. IO transistor 44 further comprises epitaxial layers 56 and 58 formed on fins 55 and 57, respectively, and electrically-conductive layers 60 described above. During the operation of device 11, layers 60 and fins 55 and 57 are configured to serve as terminals connected to wells 62 and 63, respectively, for exchanging IO signals between device 11 and other devices.

Reference is now made to an inset 19 showing a sectional view of core transistor 33 and IO transistor 44 formed adjacent to one another. In the present example, n-well 65 of core transistor 33 and p-well 62 of transistor 44 may be formed in contact with one another.

In some embodiments, the dopant concentration in well 65 is smaller compared to that of well 62, so that device 11 may comprise an isolation trench (not shown) to prevent mobility and/or recombination of charge-carriers therebetween. In other embodiments, the dopant concentration in wells 62 and 65 is similar or approximately similar, so that the n-type dopants of well 65 and the p-type dopants of well 62 are neutralizing one another, so that no physical isolation (e.g., trench) is required.

Reference is now made to an inset 15 showing a top view of an implementation of BJT 22. In some embodiments, BJT 22 comprises an emitter 73, a base 72 and a collector 71. Each BJT 22 may comprise a PNP configuration or an NPN configuration. The configuration of the BJT is based on the doping types of the three main terminal regions, emitter 73, base 72 and collector 71. An NPN configuration comprises two semiconductor junctions that share a thin p-doped region (also referred to herein as a p-well), and a PNP configuration comprises two semiconductor junctions that share a thin n-doped region (also referred to herein as an n-well). A sectional view AA of BJT 22 is shown and described in detail herein.

Reference is now made to an inset 16 showing the aforementioned sectional view AA of BJT 22. In some embodiments, BJT 22 has a PNP configuration, and comprises a p-well 66 of emitter 73, one or more p-wells 66 of collector 71, and one or more n-wells 77 of base 72. The entire structure of BJT 22 is described in detail herein.

In some embodiments, the concentration of dopants in p-well 66 of emitter 73 and in p-well 66 of collectors 71 may be similar. For example, between about $3*10^{15}$ ions per $Cm^3$ and $3*10^{17}$ ions per $Cm^3$. Note that in such embodiments, (i) the dopant concentration in p-well 66 is approximately equal to the combined dopant concentration in p-wells 62 and 64, and the dopant concentration in n-well 77 is approximately equal to the combined dopant concentration in n-wells 63 and 65. In other words, when the size of all wells is similar, the number of dopants in p-well 66 is approximately equal to the combined number of dopants in p-wells 62 and 64, and similarly, the number of dopants in n-well 77 is approximately equal to the combined number of dopants in n-wells 63 and 65.

In other embodiments, the concentration of dopants in p-well 66 of emitter 73 may differ from the concentration of dopants in p-well 66 of collector 71. In such embodiments, (i) the dopant concentration in p-well 66 of collector 71 is approximately equal to the combined dopant concentration in p-wells 62 and 64, and the dopant concentration in n-well 77 is approximately equal to the combined dopant concentration in n-wells 63 and 65. Note that in both configurations, the dopant concentration in the wells of BJT 22 is greater than the dopant concentration in the wells of (i) core transistor 33, or (ii) IO transistor 44. This configuration of dopant concentration is obtained using a process sequence described in detail in FIG. 2 below.

In some embodiments, emitter 73 and each collector 71 comprise one or more fins 55, connected to p-well 66, and epitaxial layer 56 formed on fins 55, which are all doped with p-type dopants. Each base 72 comprises one or more fins 57, connected to n-well 77, and epitaxial layer 58, which are all doped with n-type dopants.

In some embodiments, wells 66 and 77 are formed by implantation of p-type and n-type ions, respectively, in substrate 50, whereas fins 55 and 57 are formed on the surface of substrate 50.

In some embodiments, BJT 22 comprises dielectric layer 59, which is configured to electrically isolate between fins 55 and 57, so that the charge carries (i.e., electrons and/or holes) are conducted within the wells and source-drain (not shown) formed in substrate 50.

In some embodiments, BJT 22 comprises electrically-conductive layers 60, connected to fins 55 and 57 and configured to serve as terminals connected to p-wells 66 and n-wells 77, respectively. BJT 22 further comprises a deep n-well 52, also referred to herein as an isolation well, which is formed in substrate 50. In some embodiments, deep n-well 52 serves as the base of BJT 22, and n-wells 77 serve as the connection between the base contact at the top (e.g., using layers 58 and 60) and the base (deep n-well 52).

In principle, technology nodes (e.g., 20 nm node and larger) that are applicable to BJTs having large dimensions (e.g., 10 µm by 10 µm), support the production of devices comprising at least BJTs and unipolar (e.g., core) transistors. In such technology nodes, the dopant concentrations in the wells of the unipolar transistors and the BJTs are similar (e.g., the dopant concentration in wells 64 and 65 described above). In advanced technology nodes (e.g., 5 nm nodes or 7 nm nodes), however, using the same dopant concentration of the unipolar transistors wells in the BJT wells, may result in increased noise level in the BJTs, and consequently, in insufficient matching among BJTs of the given device. For example, in device 11, forming wells 66 and 77 of BJTs 22 with the same dopant concentration of wells 64 and 65, e.g., between about $1*10^{15}$ ions per $Cm^3$ and $1*10^{17}$ ions per $Cm^3$, may cause mismatching among BJTs of device 11. In such devices, small variations in an absolute number of dopants in a well may result in a relatively large variation in the matching of electrical performance among the BJTs, due to the minute size of the wells and other physical attributes related to the small dimensions of the device.

In the context of the present disclosure, the term "mismatch" refers to a statistical variance in electrical performance (e.g., threshold voltages and threshold currents) among BJTs implemented in a common device, which is greater than a specified variance-threshold. The statistical variance of the threshold voltages and currents among BJTs, such as BJTs 22, is typically proportional to 1/N, wherein N denotes the dopant concentration in the wells of the BJTs. As an example use case, BJTs may be used as current amplifiers having a specified current amplification factor. The current amplification of the transistor can be expressed by the equation $Ic=\beta*Ib$, wherein $I_c$ denotes the collector current, $I_b$ denotes the base current, and $\beta$ denotes the amplification factor. In such devices, insufficient concentration of dopants in a BJT may undesirably reduce the amplification factor and/or may result in different amplification factors among different BJTs.

In some embodiments, the dopant concentration in the wells of BJT 22, is greater than the dopant concentration in the wells of core transistor 33 and in the wells of IO transistor 44. The disclosed techniques enable sufficiently-high dopant concentration in wells 66 and 77 so as to obtain improvement of matched electrical performance among BJTs 22 of device 11, without adding process steps to the production flow of device 11, as will be described in FIGS. 2 and 3 below. In the present example, the sufficiently-high dopant concentration in wells 66 and 77, improves the matching of electrical performance ((e.g., threshold voltages and threshold currents) among BJTs 22 of device 11.

In BJT 22, emitter 73, base 72 and collector 71 have respective electrical resistances. In some embodiments, the dopant concentration in wells 66 and 77 improves (e.g., reduces) the series resistance of base 72 and collector 71, and also the resistance of emitter 73. In some embodiments, reduction in series resistance may also improve the range of frequency response of BJT 22. The term frequency response refers to a quantitative measure of the output spectrum of a system or device (in the present example, BJT 22) in response to a stimulus, and is used to characterize the dynamics of BJT 22.

This particular configuration of device 11 and specifically BJT 22, and transistors 33 and 44, is shown by way of example in order to illustrate certain problems that are addressed by disclosed embodiments and to demonstrate the application of these embodiments in enhancing the performance of such devices comprising one or more bipolar junction transistors. The disclosed techniques, however, are by no means limited to this specific sort of example device and transistors, and the principles described herein may similarly be applied to other sorts of electronic devices and modules.

Figure 2:
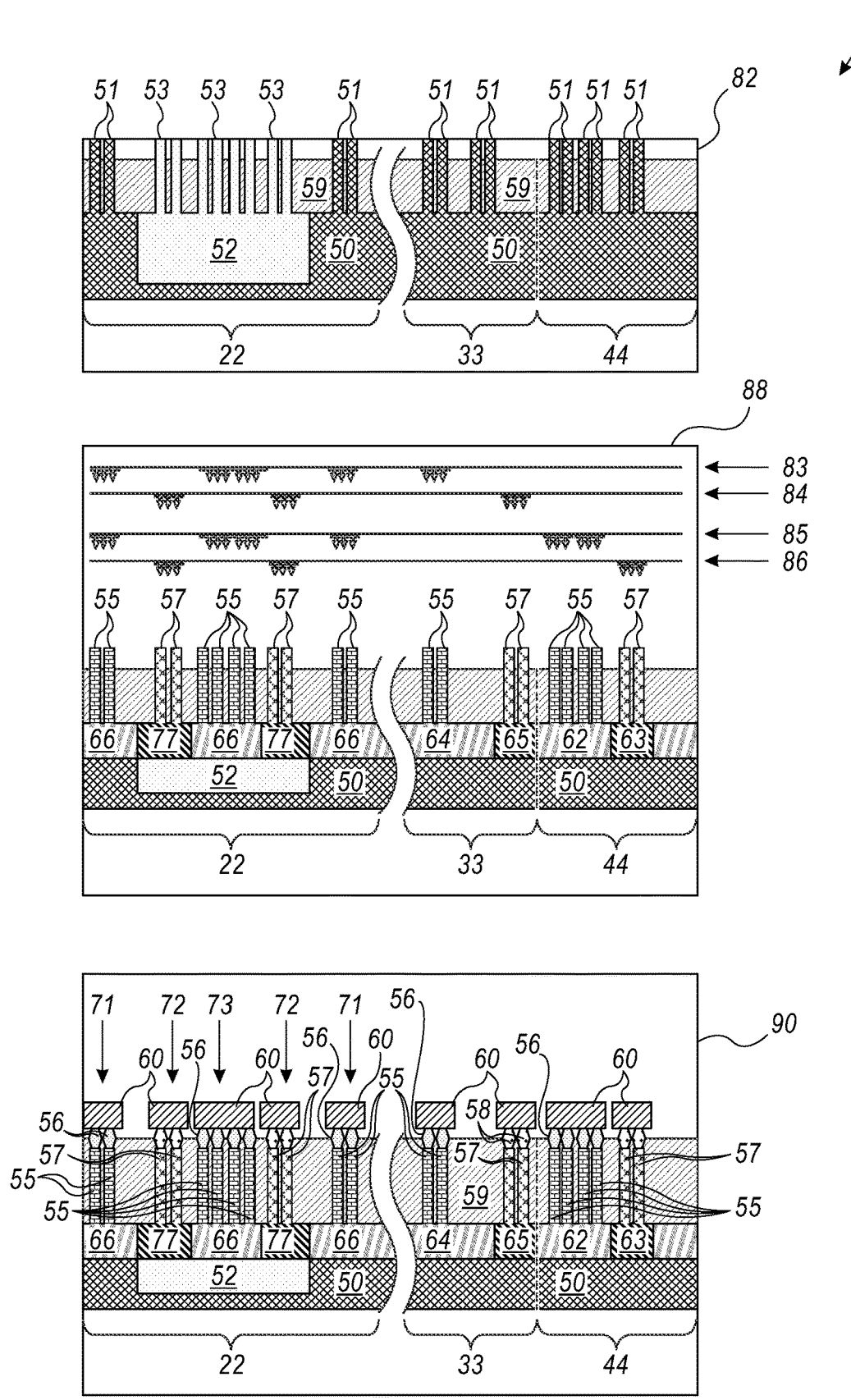
FIG. 2 is a diagram that schematically illustrates a sectional view of a process sequence for producing a semiconductor device comprising a BJT a core transistor and an input output (IO) transistor, in accordance with an embodiment that is described herein.

FIG. 2 is a diagram that schematically illustrates a sectional view of a process sequence 80 for producing semiconductor device 11 comprising BJT 22 core transistor 33 and IO transistor 44, in accordance with an embodiment that is described herein.

In some embodiments, the operations of process sequence 80 described herein, and also the production method described in FIG. 3 below, apply any suitable Complementary Metal Oxide Semiconductor (CMOS) processes, such as but not limited to: (a) thin-film (TF) deposition using chemical vapor deposition (CVD), metalorganic CVD (MOCVD), physical vapor deposition (PVD) also referred to herein as sputtering, atomic layer deposition (ALD), and epitaxial layer deposition, (b) various types of reactive-ion etching (RIE), wet etching, and other types of etching processes, (c) photoresist (PR)-based photolithography, (d) polishing and planarization processes, such as chemical mechanical polishing (CMP) or applying polyimide and spinning for obtaining planar surfaces, or selective etch-back processes, (e) various processes of mask removal, such as but not limited to photoresist ashing, photoresist stripping and hard-mask etching, note that a combination of the etching processes (b) and lithography and mask removal processes (c and e) is also referred to herein as patterning, and (f) ion implantation or diffusion processes for applying the p-type and n-type dopants in substrate 50, so as to produce the p-type substrate, the wells and the source-drain of transistors 33 and 44, and of BJT 22, which are described in FIG. 1 above.

In some embodiments, the operations of process sequence 80 are described in insets 82, 88 and 90, each of which describing multiple operations depicted in detail below. Note that in an embodiment the operations of inset 82 are carried out before the operations of inset 88, which are carried out before the operations of inset 90.

Reference is now made to inset 82. In some embodiments, fins 51 are produced on the surface of substrate 50, typically using the deposition and patterning processes of silicon, as described above. In an embodiment, deep n-well 52 is formed by ion implantation after producing fins 51, thus, the silicon fins of the intended emitter 73 and base 72 are also doped with n-type dopants and are referred to herein as fins 53 as shown in inset 82. In another embodiment, the formation of deep n-well 52 may be carried out before the formation of fins 51, so that all the fins of device 11 are similar and are referred to as fins 51.

In some embodiments, dielectric layer 59 is formed between fins 51 using any suitable CVD and patterning processes, followed by one or more CMP processes for flattening the surface of dielectric layer 59. In other embodiments, dielectric layer 59 is formed prior to the formation of fins 51, and subsequently, trenches are patterned in dielectric layer 59 and filled by depositing fins 51, typically using a CVD process or an epitaxial growth process of fins 51.

Reference is now made to inset 88, which is depicting at least four sets of ion implantation process operations 83, 84, 85 and 86. Note that each set of ion implantation process operations comprises at least: (i) a pattern definition operation using a suitable mask (hard mask or photoresist mask) and a photolithography process, (ii) an ion implantation process, and (iii) removal of the mask after performing the ion implantation process.

In some embodiments shown in process operations 83, which is also referred to herein as core p-well implant, the pattern definition exposes the intended areas of p-wells 66 of BJT 22, p-well 64 of each core transistor 33, and the respective fins formed thereon. Subsequently, the intended areas of p-wells 64 and 66, and the fins formed in contact therewith, are implanted with p-type dopants.

Similarly, in process operations 84, also referred to herein as core n-well implant, the pattern definition exposes the intended areas of n-wells 77 of BJT 22 and n-well 65 of each core transistor 33, and the respective fins in contact therewith. Subsequently, the intended areas of n-wells 77 and 65, and the fins formed in contact therewith, are implanted with n-type dopants. Note that after process operations 83 and 84 (i.e., core p-well and core n-well implants), the ion implantation process operations of core transistors 33 are concluded, and the dopant concentration in wells 64 and 65 of core transistors 33 is between about $1*10^{15}$ ions per $Cm^3$ and $1*10^{17}$ ions per $Cm^3$, as described in FIG. 1 above.

In process operations 85, also referred to herein as IO p-well implant, the pattern definition exposes the intended areas of p-wells 66 of BJT 22, p-wells 62 of each IO transistor 44, and the respective fins in contact therewith. Subsequently, the intended areas of p-wells 62 and 66, and the fins formed in contact therewith, are implanted with p-type dopants. Similarly, in process operations 86, also referred to herein as IO n-well implant, the pattern definition exposes the intended areas of n-wells 77 of BJT 22 and n-well 63 of each IO transistor 44, and the respective fins in contact therewith. Subsequently, the intended areas of n-wells 77 and 63, and the fins formed in contact therewith, are implanted with n-type dopants. Note that after process operations 85 and 86 (i.e., IO p-well and IO n-well implants), the ion implantation process operations of both BJTs 22 and IO transistors 44 are concluded. Therefore, the dopant concentration in wells 62 and 63 of IO transistors 44 is between about $2*10^{15}$ ions per $Cm^3$ and $2*10^{17}$ ions per $Cm^3$, as described in FIG. 1 above.

Note that in process operations 83-86, (i) wells 64 and 65 receive the core-well implants, (ii) wells 62 and 63 receive the IO-well implants, and (iii) wells 66 and 77 of BJT 22, receive both the core-well implants and the IO-well implants. Therefore, at least one of, and typically each BJT 22, has a dopant concentration greater than that of each core transistor 33 and each IO transistor 44. In the present example, (i) the dopant concentration in the wells of core transistors 33 is between about $1*10^{15}$ ions per $Cm^3$ and $1*10^{17}$ ions per $Cm^3$, (ii) the dopant concentration in the wells of IO transistors 44 is between about $2*10^{15}$ ions per $Cm^3$ and $2*10^{17}$ ions per $Cm^3$, and (iii) the dopant concentration in the wells of BJTs 22 is between about $3*10^{15}$ ions per $Cm^3$ and $3*10^{17}$ ions per $Cm^3$, which sums up to the combined dopant concentration in the wells of core transistor 33 and IO transistor 44.

In some embodiments, by using the masks of (i) the core well implant and (ii) the IO well implant for the implant of BJT 22, the ion implantation process does not require dedicated process steps and masks for implanting the ions in wells 66 and 77 of BJT 22. Note that the order of process operations 83-86 is provided by way of example, and in other embodiments, the ion implantation process may be carried out using any other suitable order of operations, and any additional operations between process operations 83-86. In alternative embodiments, any other suitable ion implantation process may be used for obtaining, in one or more BJTs 22, dopant concentration greater than that of at least one of core transistor 33 and IO transistor 44.

In some embodiments, after process operations 83-86 the transistors of device 11, including the fins, are doped with p-type and n-type ions, and therefore, are referred to herein as fins 55 and 57 as described in FIG. 1 above.

In alternative embodiments, well 66 of emitter 73 may have an additional ion implantation step, so as to obtain a greater dopant concentration compared to that of wells 66 of collector 71.

Reference is now made to inset 90. In some embodiments, after concluding the ion implantation described process operations 83-86, the process sequence comprises completing the remaining process operations for producing BJTs 22, core transistors 33 and IO transistors 44, whose structure is described in FIG. 1 above.

In some embodiments, the remaining process operations comprise, inter alia, (i) the formation of epitaxial layers 56 and 58 (e.g., using ALD and patterning processes) on the upper surface of fins 55 and 57, respectively, and (ii) the formation of electrically-conductive layers 60, using PVD or CVD processes.

In other embodiments, epitaxial layers 56 and 58 may be formed before process operations 83-86, e.g., when forming the structure shown in inset 82, so that the ion implantation of process operations 83-86 may be applied also to epitaxial layers 56 and 58.

Figure 3:
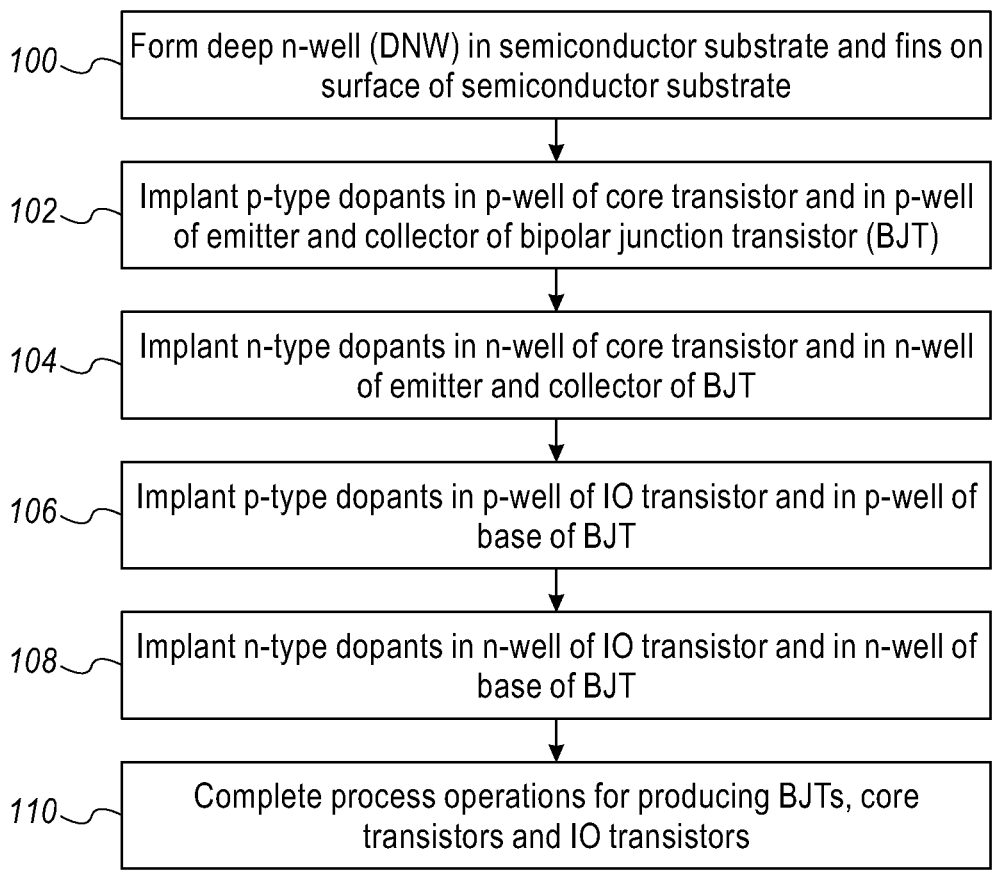
FIG. 3 is a flow chart that schematically illustrates a method for producing a semiconductor device comprising a BJT a core transistor and an input output (IO) transistor, in accordance with embodiments that are described herein.

FIG. 3 is a flow chart that schematically illustrates a method for producing semiconductor device 11 comprising one or more BJTs 22, core transistors 33 and IO transistors 44, in accordance with embodiments that are described herein.

The method begins at an operation 100 with forming deep n-well (DNW) 52 in semiconductor substrate 50 and fins 51 and 53 on the surface of semiconductor substrate 50, as described in detail in FIG. 2 above.

At an operation 102, p-type dopants are implanted in p-wells 64 of core transistor 33 and in p-wells 66 of emitter 73 and collector 71, as described in detail in process operations 83 of FIG. 2 above. In an embodiment, the implant of p-type dopants in p-wells 64 of core transistor 33 and in p-wells 66 of BJT 22 is carried out using the same mask and a common ion implantation process step.

At an operation 104, n-type dopants are implanted in n-wells 65 of core transistor 33 and in n-wells 77 of emitter 73 and collector 71, as described in detail in process operations 84 of FIG. 2 above. In an embodiment, the implant of n-type dopants in n-wells 65 of core transistor 33 and in n-wells 77 of BJT 22 is carried out using the same mask and a common ion implantation process step.

At an operation 106, p-type dopants are implanted in p-wells 62 of IO transistor 44 and in p-wells 66 of emitter 73 and collector 71, as described in detail in process operations 85 of FIG. 2 above. In an embodiment, the implant of p-type dopants in p-wells 62 of IO transistor 44 and in p-wells 66 of BJT 22 is carried out using the same mask and a common ion implantation process step.

At an operation 108, n-type dopants are implanted in n-wells 63 of IO transistor 44 and in n-wells 77 of emitter 73 and collector 71, as described in detail in process operations 86 of FIG. 2 above. In an embodiment, the implant of n-type dopants in n-wells 63 of IO transistor 44 and in n-wells 77 of BJT 22 is carried out using the same mask and a common ion implantation process step.

At an operation 110 that concludes the method, the method comprises completion of the remaining process operations for producing BJTs 22, core transistors 33 and IO transistors 44, as depicted in detail in the description of inset 90 of FIG. 2 above.

These particular sequences of process operations described in FIGS. 2 and 3, is provided by way of example in order to illustrate certain problems that are addressed by the disclosed embodiments and to demonstrate the application of these embodiments in enhancing the performance of such devices comprising one or more bipolar junction transistors. The disclosed techniques, however, are by no means limited to this specific sort of example process sequence, and the principles described herein may similarly be applied to other sorts of process operations used for producing devices comprising both bipolar junction (BJ) transistors and non-BJ transistors.

Figure 4:
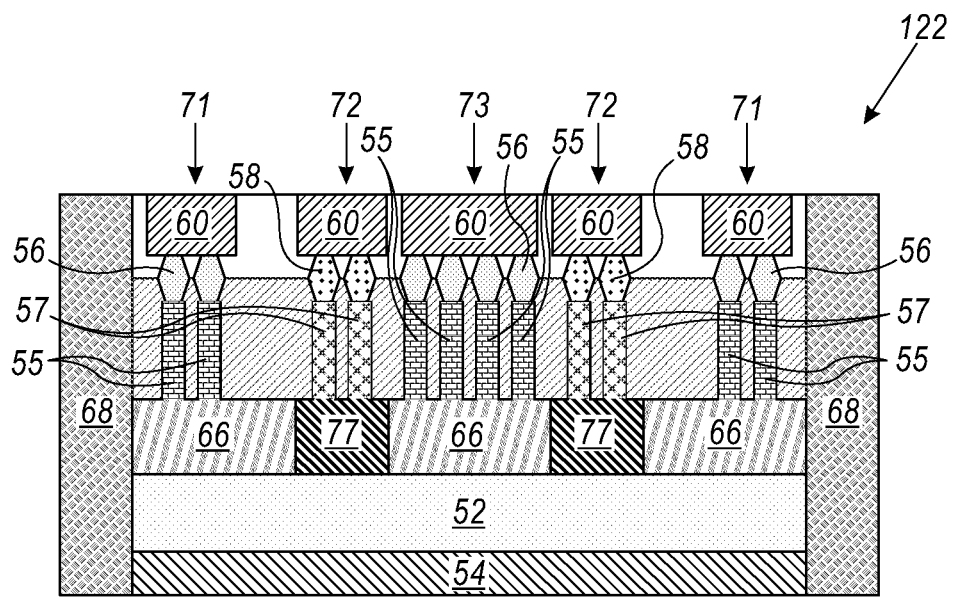
FIG. 4 is a schematic pictorial illustration of a BJT implemented in a semiconductor device, in accordance with another embodiment that is described herein.

FIG. 4 is a schematic pictorial illustration of a BJT 122 implemented in a semiconductor device (not shown), in accordance with another embodiment that is described herein. In some embodiments, one or more BJTs 122 may replace, for example, one or more BJTs, such as BJT 22 shown in FIG. 1 above.

In some embodiments, BJT 122 comprises a deep n-well 54 and one or more trenches 68, in addition to the structure of BJT 22 described in detail in FIG. 1 above. Trenches 68 typically are formed using etching techniques, and are filled with dielectric materials, such as silicon dioxide, or polycrystalline silicon with silicon dioxide, or any suitable type of low-k dielectric substance having a dielectric constant smaller than 2.9. Trenches 68 are configured to electrically isolate collector 71, e.g., from other charge carriers formed within or passing through substrate 50.

In some embodiments, deep n-well 54 is typically formed by implanting n-type ions into the bulk of substrate 50, e.g., between about 1.5 µm and 3 µm from the surface of substrate 50. Deep n-well 54 is typically formed before forming deep n-well 52 and the other structures and features of the BJTs, such as BJT 22, as described above. In alternative embodiments, deep n-well 54 may be formed by implanting n-well ion at least on the surface of substrate 50, followed by the deposition of epitaxial semiconductor layers (e.g., silicon) for producing the features of BJTs 122 thereon.

In some embodiments, deep n-well 54 is configured to electrically isolate between P-type collector 71 and substrate 50, so as to: (i) improve, inter alia, the matching in electrical performance (e.g., threshold voltages and threshold currents) among multiple BJTs 122 of the same device, and (ii) increase the amplification factor of the BJT and improve the matching of the amplification factor among different BJTs of the same device.

In some embodiments, by improving the inter-BJTs matching, the electrical performance is also improved, e.g., in BJT-based devices having PNP configuration (or NPN configuration), for example in bandgap circuits. A typical example of a circuit that requires good matching between BJTs is a current mirror that aims to mirror the current of a current source. When implementing the current source and the current mirror using respective BJTs, the matching between the BJTs determines the overall current-mirroring accuracy. Or alternatively, to achieve the same matching accuracy, a smaller sized BJT is sufficient.

This particular configuration of BJT 122 is shown by way of example in order to illustrate certain problems that are addressed by disclosed embodiments and to demonstrate the application of these embodiments in enhancing the performance of such devices comprising one or more bipolar junction transistors, such as BJT 122. The disclosed techniques, however, are by no means limited to this specific sort of example device and transistors, and the principles described herein may similarly be applied to other sorts of electronic devices and BJTs.

Although the embodiments described herein mainly address bipolar junction transistors in semiconductor devices, the methods and systems described herein can also be used in other applications, such as in a silicon controlled rectifier (SCR) or other sort of devices, such as electrostatic discharge (ESD) devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for producing a semiconductor device, the method comprising:

forming, on a substrate made from a semiconductor substance, at least one bipolar junction (BJ) transistor comprising a first terminal connected to a first well, the first well formed in the substrate and comprising a first dopant having a first dopant concentration;

forming on the substrate at least one non-BJ transistor, comprising a second terminal connected to a second well, the second well formed in the substrate and comprising a second dopant having a same polarity as the first dopant, wherein the first dopant concentration of the BJ transistor is higher than a second dopant concentration of the non-BJ transistor; and forming on the substrate at least an additional non-BJ transistor, different from the non-BJ transistor, the additional non-BJ transistor comprising a third terminal directly connected to a third well, the third well formed in the substrate and comprising a third dopant having (i) the same polarity as the first dopant and (ii) a third dopant concentration that is lower than the first dopant concentration.

2. The method according to claim 1, wherein forming the BJ transistor, the non-BJ transistor and the additional non-BJ transistor comprises: forming (i) the first dopant in the first well and (ii) the second dopant in the second well, using a first mask; and forming: (i) the first dopant in the first well and (ii) the third dopant in the third well, using a second mask.

3. The method according to claim 1, wherein forming the BJ transistor comprises: (i) implanting the second dopant in the first well, and (ii) implanting the third dopant in the first well.

4. The method according to claim 3, wherein implanting the second dopant comprises implanting the second dopant in the first well and in the second well at a first time interval, and wherein implanting the third dopant comprises implanting the third dopant in the first well and in the third well at a second time interval, different from the first time interval.

5. The method according to claim 1, wherein forming the BJ transistor, the non-BJ transistor, and the additional non-BJ transistor comprises forming the first dopant, the second dopant and the third dopant using a same dopant substance.

6. The method according to claim 1, wherein forming at least one of the BJ transistor, the non-BJ transistor and the additional non-BJ transistor, comprises forming a fin field-effect transistor (finFET) by forming at least a three-dimensional gate over at least one of the first well, the second well and the third well.

7. The method according to claim 1, wherein forming at least one of the BJ transistor, the non-BJ transistor and the additional non-BJ transistor, comprises forming a planar field-effect transistor (FET) by forming at least a two-dimensional gate over at least one of the first well, the second well and the third well.

8. The method according to claim 1, wherein forming at least one of the BJ transistor, the non-BJ transistor and the additional non-BJ transistor, comprises forming a gate-all-around (GAA) transistor, by forming at least a 3D-wire gate over at least one of the first well, the second well and the third well.

9. The method according to claim 1, wherein forming the BJ transistor comprises forming at least: (i) an emitter having an emitter well, (ii) a base having a base well, and (iii) a collector having a collector well, wherein the emitter well and the collector well have a first polarity and the base has a second polarity that is opposite to the first polarity, and comprising forming within the substrate an isolation well for insulating between: (i) the collector well and (ii) the emitter well and base well.

10. A device, comprising:
a semiconductor substrate;
at least one bipolar junction (BJ) transistor, comprising a first terminal connected to a first well, the first well formed in the substrate and comprising a first dopant having a first dopant concentration;
at least one non-BJ transistor, comprising a second terminal connected to a second well, the second well formed in the substrate and comprising a second dopant having a same polarity as the first dopant wherein the first dopant concentration of the BJ transistor is higher than a second dopant concentration of the non-BJ transistor; and
at least an additional non-BJ transistor, different from the non-BJ transistor, the additional non-BJ transistor comprising a third terminal directly connected to a third well, the third well formed in the substrate and comprising a third dopant having (i) the same polarity as the first dopant and (ii) a third dopant concentration that is lower than the first dopant concentration.

11. The device according to claim 10, wherein the first well comprises the second dopant and the third dopant.

12. The device according to claim 10, wherein the first dopant, the second dopant and the third dopant comprise a same dopant substance.

13. The device according to claim 10, wherein the non-BJ transistor comprises one of a core transistor and an input-output (IO) transistor.

14. The device according to claim 10, wherein the additional non-BJ transistor comprises one of a core transistor and an input-output (IO) transistor.

15. The device according to claim 10, wherein at least one of the BJ transistor, the non-BJ transistor and the additional non-BJ transistor, comprises a fin field-effect transistor (finFET) having at least a three-dimensional gate formed over at least one of the first well, the second well and the third well.

16. The device according to claim 10, wherein at least one of the BJ transistor, the non-BJ transistor and the additional non-BJ transistor, comprises a planar field-effect transistor (FET) having at least a two-dimensional gate formed over at least one of the first well, the second well and the third well.

17. The device according to claim 10, wherein at least one of the BJ transistor, the non-BJ transistor and the additional non-BJ transistor, comprises a gate-all-around (GAA) transistor, having at least a 3D-wire gate formed over at least one of the first well, the second well and the third well.

18. The device according to claim 10, wherein the BJ transistor comprises at least: (i) an emitter having an emitter well, (ii) a base having a base well, and (iii) a collector having a collector well, wherein the emitter well and the collector well have a first polarity and the base has a second polarity that is opposite to the first polarity, and comprising an isolation well, formed within the substrate for insulating between: (i) the collector well and (ii) the emitter well and base well.

19. A semiconductor device, comprising:
at least one bipolar junction (BJ) transistor, formed by producing on a substrate made from a semiconductor substance, a first well comprising a first dopant having a first dopant concentration, and connecting the first well to a first terminal;
at least one non-BJ transistor, formed by producing on the substrate a second well, comprising a second dopant having a same polarity as the first dopant, and connecting the second well to a second terminal, wherein the first dopant concentration of the BJ transistor is higher than a second dopant concentration of the non-BJ transistor; and
at least an additional non-BJ transistor, different from the non-BJ transistor, the additional non-BJ transistor is formed by producing on the substrate a third well, and directly connecting the third well to a third terminal, the third well comprising a third dopant having (i) the same polarity as the first dopant and (ii) a third dopant concentration that is lower than the first dopant concentration.

* * * * *